(12) United States Patent  
Porter

(10) Patent No.: US 8,406,027 B2
(45) Date of Patent: *Mar. 26, 2013

(54) SYSTEM AND METHOD FOR MITIGATING REVERSE BIAS LEAKAGE

(75) Inventor: John D. Porter, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/210,709

(22) Filed: Aug. 16, 2011

(65) Prior Publication Data

US 2011/0317473 A1    Dec. 29, 2011

Related U.S. Application Data

(63) Continuation of application No. 12/721,290, filed on Mar. 10, 2010, now Pat. No. 8,009,487, which is a continuation of application No. 12/118,420, filed on May 9, 2008, now Pat. No. 7,692,975.

(51) Int. Cl.
*G11C 5/02* (2006.01)
*G11C 7/10* (2006.01)

(52) U.S. Cl. ............... 365/51; 365/189.06; 365/189.11

(58) Field of Classification Search ............ 365/51
See application file for complete search history.

(56) References Cited

U.S. PATENT DOCUMENTS

| | | | |
|---|---|---|---|
| 4,733,372 A | 3/1988 | Nanbu et al. | |
| 4,999,813 A | 3/1991 | Ohtsuka et al. | |
| 5,175,128 A * | 12/1992 | Ema et al. | 438/254 |
| 5,216,630 A | 6/1993 | Nakase | |
| 5,307,307 A | 4/1994 | Wada et al. | |
| 5,465,233 A | 11/1995 | Slemmer | |
| 5,822,257 A | 10/1998 | Ogawa | |
| 5,825,694 A | 10/1998 | Okimoto et al. | |
| 5,835,419 A | 11/1998 | Ichimura et al. | |
| 5,892,703 A * | 4/1999 | Raad | 365/51 |
| 5,923,605 A * | 7/1999 | Mueller et al. | 365/230.03 |
| 5,986,915 A | 11/1999 | Okimoto et al. | |
| 5,991,211 A | 11/1999 | Kato et al. | |
| 6,038,159 A * | 3/2000 | Raad | 365/51 |
| 6,236,605 B1 | 5/2001 | Mori et al. | |

(Continued)

FOREIGN PATENT DOCUMENTS

EP    1039471 A2    9/2000
EP    1548745 A1    6/2005

(Continued)

OTHER PUBLICATIONS

Bedeschi, F., et al. "An 8Mb Demonstrator for High-Density 1.8V Phase-Change Memories," IEEE 2004 Symposium on VLSI Circuits, Digest of Technical Papers, pp. 442-445. (2004).

(Continued)

*Primary Examiner* — Son Mai
(74) *Attorney, Agent, or Firm* — Brooks, Cameron & Huebsch, PLLC

(57) ABSTRACT

The present disclosure includes devices, methods, and systems for programming memory, such as resistance variable memory. One embodiment can include an array of resistance variable memory cells, wherein the resistance variable memory cells are coupled to one or more data lines, a row decoder connected to a first side of the array, a column decoder connected to a second side of the array, wherein the second side is adjacent to the first side, a gap located adjacent to the row decoder and the column decoder, and clamp circuitry configured to control a reverse bias voltage associated with one or more unselected memory cells during a programming operation, wherein the clamp circuitry is located in the gap and is selectively coupled to the one or more data lines.

24 Claims, 9 Drawing Sheets

U.S. PATENT DOCUMENTS

| | | |
|---|---|---|
| 6,385,074 B1 | 5/2002 | Johnson et al. |
| 6,462,984 B1 | 10/2002 | Xu et al. |
| 6,577,521 B2 * | 6/2003 | Raad ............................. 365/51 |
| 6,667,900 B2 | 12/2003 | Lowery et al. |
| 6,828,842 B2 | 12/2004 | Saito et al. |
| 6,873,561 B2 | 3/2005 | Ooishi |
| 6,888,774 B2 * | 5/2005 | Suzuki et al. ............ 365/230.03 |
| 6,961,264 B2 | 11/2005 | Tsuchida |
| 7,196,943 B2 | 3/2007 | Mirichigni et al. |
| 7,266,016 B2 | 9/2007 | Kameda |
| 7,304,888 B2 | 12/2007 | Knall |
| 7,307,268 B2 | 12/2007 | Scheuerlein |
| 7,408,212 B1 | 8/2008 | Luan et al. |
| 7,596,035 B2 | 9/2009 | Doyle et al. |
| 7,602,654 B2 | 10/2009 | Yabuuchi et al. |
| 7,692,975 B2 * | 4/2010 | Porter ...................... 365/189.06 |
| 7,929,367 B2 * | 4/2011 | Yoo et al. ...................... 365/222 |
| 7,936,594 B2 * | 5/2011 | Park et al. ..................... 365/163 |
| 8,009,487 B2 * | 8/2011 | Porter ...................... 365/189.06 |
| 8,107,312 B2 * | 1/2012 | Park et al. ................ 365/230.06 |
| 8,159,898 B2 * | 4/2012 | Yoon ....................... 365/230.03 |
| 2003/0026134 A1 | 2/2003 | Lowrey |
| 2003/0048684 A1 | 3/2003 | Tanzawa et al. |
| 2005/0047193 A1 | 3/2005 | Bedeschi et al. |
| 2005/0185444 A1 | 8/2005 | Yang et al. |
| 2006/0083078 A1 | 4/2006 | Sforzin et al. |
| 2007/0211545 A1 | 9/2007 | Otsuka et al. |
| 2008/0031067 A1 | 2/2008 | Lovett |

FOREIGN PATENT DOCUMENTS

| | | |
|---|---|---|
| JP | 2005-166087 | 6/2005 |
| JP | 2006-332609 | 12/2006 |
| KR | 10-1999-0077852 A | 10/1999 |
| KR | 10-2002-0046321 A | 6/2002 |
| WO | 02078003 A2 | 10/2002 |
| WO | 2008-050398 | 5/2008 |

OTHER PUBLICATIONS

Lee, Kwang-Jin, et al. "A 90nm 1.8V 512Mb Diode-Switch PRAM with 266M/bs Read Throughput," IEEE 2007 International Solid State Circuits Conference, Session 26, pp. 472-473, 616. (2007).

International Search Report and Written Opinion for related PCT Application PCT/US2009/002355, dated Dec. 17, 2009 (15 pages).

European Search Report for related European Application No. 09742980.7 dated May 30, 2011 (7 pages).

Preliminary Rejection for related Korean Application No. 10-2010-7027663, mailed Jun. 18, 2012, (3 pages).

Japanese Notice of Rejection Grounds for related Japanese Patent Application No. 2011-508480, mailed Sep. 4, 2012, (5 pgs.).

* cited by examiner

SYSTEM AND METHOD FOR MITIGATING REVERSE BIAS LEAKAGE

PRIORITY APPLICATION INFORMATION

This application is a Continuation of U.S. patent application Ser. No. 12/721,290, filed Mar. 10, 2010, which is a Continuation of U.S. patent application Ser. No. 12/118,420, filed May 9, 2008 and issued as U.S. Pat. No. 7,692,975 on Apr. 6, 2010, the specifications of which are incorporated herein by reference.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, and resistance variable memory, among others.

Memory can be volatile or non-volatile. Volatile memory requires power to maintain the information stored therein, e.g., when power to volatile memory is lost, the information stored therein is also lost. Non-volatile memory, in contrast, does not lose the information stored therein in the absence of power, e.g., non-volatile memory can retain the information stored therein even if no power is being provided to the memory. Types of volatile memory include RAM, DRAM, and SDRAM, among others. Types of non-volatile memory include ROM, flash memory, and resistance variable memory, among others.

Types of resistance variable memory include programmable conductor memory, phase change random access memory (PCRAM), and resistive random access memory (RRAM), among others. A physical layout of a PCRAM memory device can resemble that of a DRAM device, with the capacitor of the DRAM cell being replaced by a phase change material, such as Germanium-Antimony-Telluride (GST). A physical layout of an RRAM memory device may include memory cells including a variable resistor thin film, e.g., a colossal magnetoresistive material, which can be connected to an access device, such as a diode, a field effect transistor (FET), or a bipolar junction transistor (BJT), for example.

The memory cell material of a PCRAM device, e.g., GST, can exist in an amorphous, high resistance state, or a crystalline, low resistance state. The resistance state of the PCRAM cell can be altered by applying current pulses to the cell. For example, the resistance state of the PCRAM cell can be altered by heating the cell with a programming current. This results in the PCRAM cell being programmed to a particular resistance state. In a binary system, for example, the amorphous, high resistance state can correspond to a logic state of 1, and the crystalline, low resistance state can correspond to a logic state of 0. However, the choice of these corresponding logic states is arbitrary, that is, in other binary systems, the amorphous, high resistance state can correspond to a logic state of 0, and the crystalline, low resistance state can correspond to a logic state of 1. The resistance state of an RRAM cell, e.g., the variable resistor thin film, can be increased and/or decreased by applying positive and/or negative electrical pulses across the film. This can result in the RRAM cell being programmed to a particular resistance state.

A single level memory cell (SLC) can represent two programmed states as represented by the binary digits 1 or 0. Memory cells can also be programmed to more than two states, such as to a number of states that allows a cell to represent more than two binary digits, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one digit, e.g., more than one bit.

DETAILED DESCRIPTION

Devices, methods, and systems for programming resistance variable memory, such as programmable conductor memory, resistance random access memory (RRAM), and/or phase change random access memory (PCRAM), among others, are described herein. One or more embodiments can include clamp circuitry as part of a programming scheme which can minimize the reverse bias leakage associated with unselected memory cells during a programming operation.

One or more embodiments can include an array of memory cells, wherein the memory cells are coupled to one or more data lines, a row decoder connected to a first side of the array, a column decoder connected to a second side of the array, wherein the second side is adjacent to the first side, a gap located adjacent to the row decoder and the column decoder, and clamp circuitry configured to control a reverse bias voltage associated with one or more unselected memory cells during a programming operation, wherein the clamp circuitry is located in the gap and is selectively coupled to the one or more data lines.

In the following detailed description of the present disclosure, reference is made to the accompanying drawings that form a part hereof, and in which is shown by way of illustration how one or more embodiments of the disclosure may be practiced. These one or more embodiments are described in sufficient detail to enable those of ordinary skill in the art to practice the one or more embodiments of this disclosure, and it is to be understood that other embodiments may be utilized and that process, electrical, or mechanical changes my be made without departing from the scope of the present disclosure.

Figure 1:
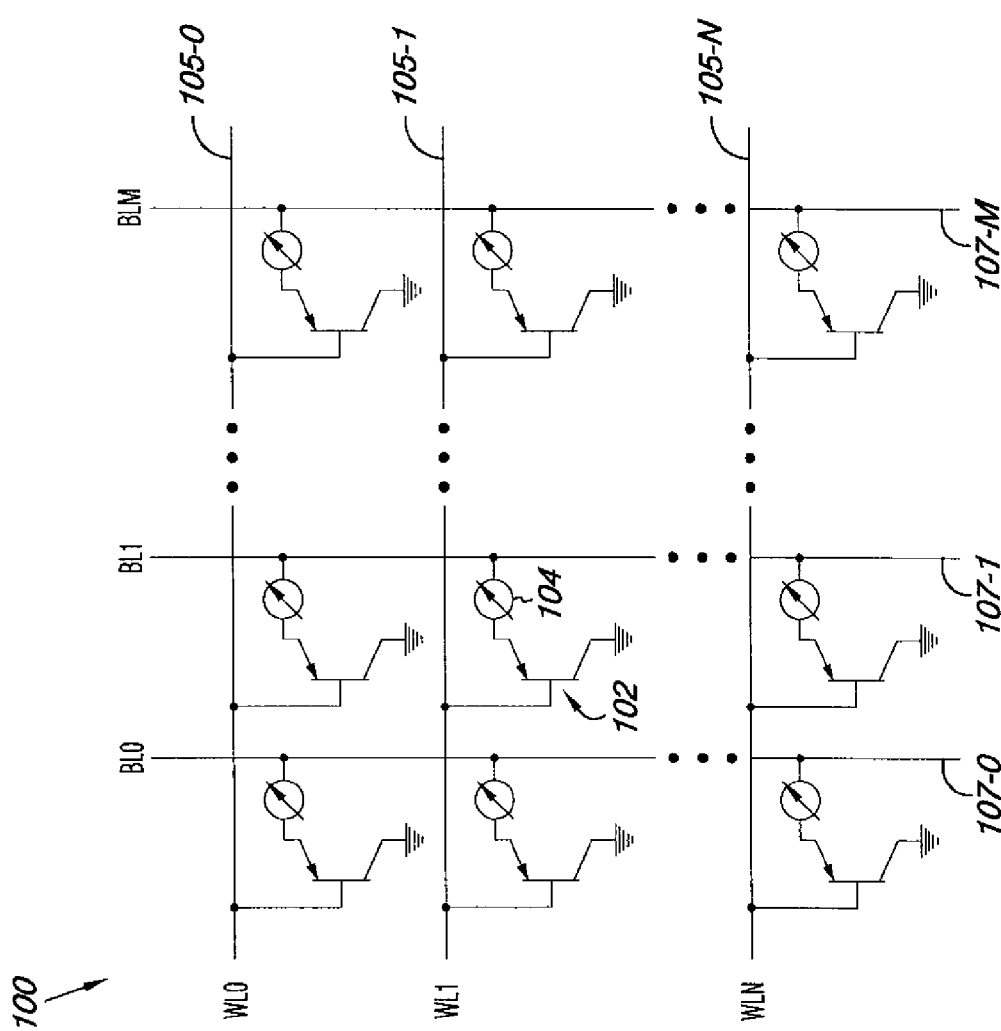
FIG. 1 is a schematic of a portion of a resistance variable memory array that can be used with one or more embodiments of the present disclosure.

FIG. 1 is a schematic of a portion of a resistance variable memory array 100 that can be used with one or more embodiments of the present disclosure. In the embodiment illustrated in FIG. 1, the memory array 100 includes a number of phase change memory cells each having an associated access device 102 and resistance variable element 104, e.g., a phase change material 104. The access devices 102 can be operated, e.g., turned on/off, to access the memory cells in order to perform operations such as data programming and/or data reading operations on the resistance variable elements 104. In the embodiment illustrated in FIG. 1, the access devices 102 are PNP bipolar junction transistors (BJTs). Alternatively, access devices 102 can be NPN BJTs, diodes, and/or metal-oxide-semiconductor field-effect-transistors (MOSFETs), among other types of access devices, as will be appreciated by one of ordinary skill in the art.

As shown in FIG. 1, a base region of each BJT 102 associated with each memory cell is coupled to one of a number of access lines, such as word lines 105-0 (WL0), 105-1 (WL1), ..., 105-N (WLN), i.e., each word line 105-0, 105-1, ... 105-N is coupled to a "row" of phase change memory cells. The designator "N" is used to indicate that a memory array can include a number of word lines. The use of the term "row" is not meant to imply a particular linear and/or horizontal orientation of the memory cells. Rather, a row can mean a number of memory cells coupled to a particular word line, regardless of the orientation of the memory cells. For example, a row can include a number of memory cells coupled to a particular word line in a staggered, non-linear orientation.

In one or more embodiments, the resistance variable elements 104 can be a phase change chalcogenide alloy such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, Al—Te, SbSe, Ge—Sb—Te, Ge—Sb—Se, Te—Ge—As, In—Sb—Te, Te—Sn—Se, Ge—Se—Ga, Bi—Se—Sb, Ga—Se—Te, Sn—Sb—Te, In—Sb—Ge, In—Sb—Se, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, and Ag—In—Sb—Se—Te, among various other phase change materials. However, embodiments of the present disclosure are not so limited, and can include impurities and/or the addition of other elements as well.

In the embodiment illustrated in FIG. 1, each resistance variable element 104 is coupled to one of a number of data lines, such as bit lines 107-0 (BL0), 107-1 (BL1), ..., 107-M (BLM), i.e., each bit line 107-0, 107-1, ..., 107-M is coupled to a "column" of phase change memory cells. The designator "M" is used to indicate that a memory array can include a number of bit lines. For ease of addressing in the digital environment, the number of word lines 105-1, ... 105-N and the number of bit lines 107-1, ..., 107-M can each be some power of two, e.g., 256 word lines by 4,096 bit lines. However, embodiments are not limited to particular numbers of word lines and/or bit lines. Further, the use of the term "column" is not meant to imply a particular linear and/or vertical orientation of the memory cells. Rather, a column can mean a number of memory cells coupled to a particular bit line, regardless of the orientation of the memory cells. For example, a column can include a number of memory cells coupled to a particular bit line in a staggered, e.g., non-linear, fashion.

In operation, appropriate voltage and/or current signals, e.g., pulses, can be applied to the bit lines 107-0, 107-1, ..., 107-M and word lines 105-0, 105-1, ... 105-N in order to program data to and/or read data from the phase change memory cells of the array 100. As an example, a phase change memory cell of array 100 can be programmed, e.g., written, to a data state by pulling the bit lines 107-0, 107-1, ..., 107-M and word lines 105-0, 105-1, ..., 105-N to one or more voltages, as will be further described herein.

Embodiments of the present disclosure are not limited to the example array 100 illustrated in FIG. 1. For example, as one of ordinary skill in the art will appreciate, the access device 102 associated with a particular memory cell can be a device other than a PNP BJT, such as an NPN BJT, a diode, and/or a MOSFET, as previously described herein. Also, a memory array can have an architecture other than that illustrated in FIG. 1, as will be understood by one of ordinary skill in the art. Further, as one of ordinary skill in the art will appreciate, the phase change memory array 100 can be coupled to programming circuitry and/or sensing circuitry (not shown in FIG. 1).

The number of phase change memory cells shown in memory array 100 can be single level cells (SLCs) and/or multilevel cells (MLCs). A single level phase change memory cell can be programmed to a generally more amorphous (reset) state or a generally more crystalline (set) state. Such reset and/or set states may correspond to a binary 0 and/or 1. A reset pulse can include a relatively high current pulse applied to the cell for a relatively short period of time. The current applied to the cell can be quickly reduced after the phase change material "melts," allowing the cell to cool quickly into a more amorphous state where atomic motion that can allow crystallization generally occurs to a lesser degree due, at least in part, to relatively rapid cooling of the material. Conversely, a set pulse can include a relatively lower current pulse applied to the cell for a relatively longer period of time with a slower quenching speed, e.g., the current may be more slowly reduced allowing the phase change material greater time to cool. Accordingly, the material may crystallize to a greater degree than after the reset pulse. Some phase change materials can have a greater resistivity associated with a more amorphous state and a lesser resistivity associated with a more crystalline state.

Multilevel phase change memory cells can be programmed to one or more intermediate states between amorphous and crystalline. That is, multilevel phase change memory cells can be programmed to various levels of structural order. Through application of one or more programming pulses at particular current levels, the cells can be programmed to a given resistance state. With appropriate programming currents, the cells can be programmed to one or more intermediate states having a partial amorphous and a partial crystalline structure, providing for multilevel resistance states. The number of programming states chosen for a particular cell can be based on, for example, the desired application, design and process limits, e.g., programming time, sensing time, and accuracy of sensing circuitry, and other factors.

In one or more embodiments, a resistance variable memory cell of a resistance variable memory array, e.g., a phase change memory cell of array 100, can be programmed, e.g., written, to a data state by pulling the bit and word lines of the array, e.g., bit lines 107-0, 107-1, . . . , 107-M and word lines 105-0, 105-1, . . . 105-N, to one or more voltages. For example, the bit line to which the programmed memory cell is coupled, e.g., the written bit line, can be pulled to a high voltage, e.g., 3.5 volts, in order to "melt" the phase change material of the programmed memory cell, and the word line to which the programmed memory cell is coupled, e.g., the written word line, can be pulled to ground, e.g., to 0 volts. Additionally, the other bit lines, e.g., the unselected bit lines, can be pulled near ground, e.g., near 0 volts, such as in order to prevent data corruption along the written word line, and the other word lines, e.g. the unselected word lines, can be pulled to a high voltage, e.g., 3.5 volts, such as in order to prevent data corruption along the written bit line. As used herein, a "programmed memory cell" means a memory cell that is to be and/or has been programmed at a particular time during a programming operation, and an "unselected memory cell" means a memory cell that is not to be and/or has not been programmed at a particular time during a programming operation. As used herein, the terms "written bit line" and "written word line" mean the bit and word lines, respectively, to which the programmed memory cell is coupled. As used herein, the terms "unselected bit lines" and "unselected word lines" mean the bit and word lines, respectively, which are not coupled to the programmed memory cell.

For example, in a programming operation designed to program the memory cell associated with access device 102 and phase change material 104, bit line 107-1 can be pulled to 3.5 volts, word line 105-1 can be pulled to ground, bit lines 107-0 and 107-M can be pulled near ground, and word lines 105-0 and 105-M can be pulled to 3.5 volts. In this example, the memory cell associated with access device 102 and phase change material 104 is the programmed memory cell, the other memory cells in array 100 are the unselected memory cells, bit line 107-1 is the written bit line, word line 105-1 is the written word line, bit lines 107-0 and 107-M are the unselected bit lines, and word lines 105-0 and 105-N are the unselected word lines. However, embodiments of the present disclosure are not limited to this example, and can include other programming operations and/or programming methods.

In one or more embodiments, any memory cell that is not coupled to either the written bit line or the written word line can have a high reverse bias voltage across it, which can cause a leakage current to flow across the memory device. For example, in the programming operation previously described herein, the memory cells coupled to bit line 107-0 and word line 105-0, bit line 107-M and word line 105-0, bit line 107-0 and word line 105-N, and bit line 107-M and word line 105-N, each have a high reverse bias voltage. Since the majority of the memory cells in the array are not coupled to either the written bit line or the written word line during a programming operation, the majority of the memory cells can have a high reverse bias voltage, which can create a significant leakage current across the memory device. Such a current leakage can increase the amount of current consumed by the memory device during a programming operation. For example, the reverse bias voltage across one such memory cell can cause a leakage current of approximately 10 picoamps. Hence, for a one Gigabit memory array, the total leakage current could be approximately 10 milliamps, which could result in an increased current consumption of approximately 10 milliamps during a programming operation of the array.

Additionally, as one of ordinary skill in the art will appreciate, in one or more embodiments the leakage current can flow from a pumped supply, which can further increase the magnitude of the effect of the reverse bias voltage on the current consumption of the memory device. That is, the current consumption of the memory device can be many times the leakage current caused by the reverse bias voltage, depending on the efficiency of the pump. For example, if the efficiency of the pump is 25%, the amount of current drawn by the memory device during a programming operation can increase by a factor of four. Hence, if a pump having a 25% efficiency is used in the programming of the one Gigabit memory array described in the previous example, the reverse bias voltage can cause an approximately 40 milliamp increase in the current consumption of the memory device during the programming operation.

Figure 2:
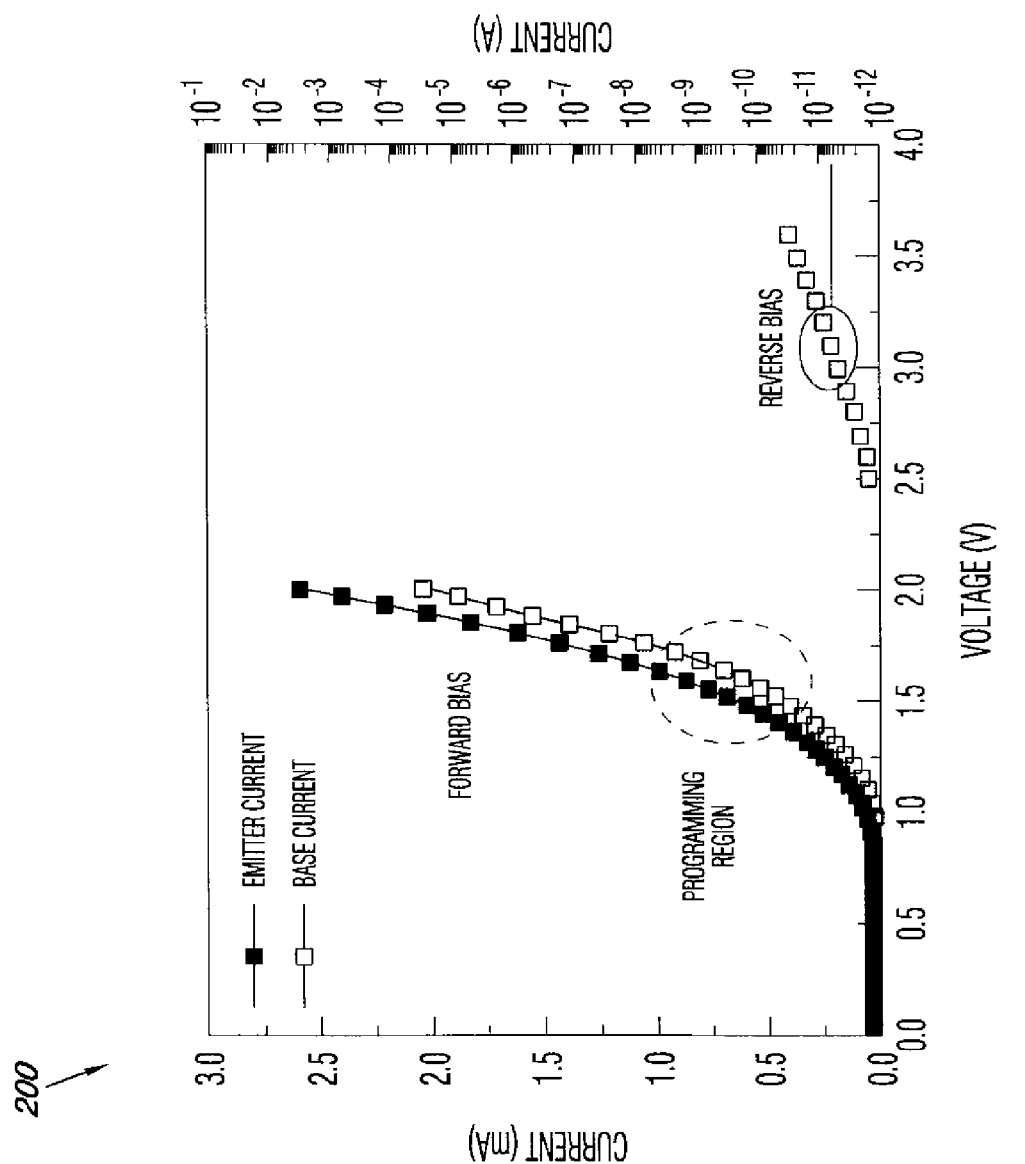
FIG. 2 is a graph illustrating the forward and reverse bias current-voltage characteristics for a PNP bipolar junction transistor that can be used as an access device in a resistance variable memory cell according to one or more embodiments of the present disclosure.

FIG. 2 is a graph illustrating the forward and reverse bias current-voltage characteristics of a PNP bipolar junction transistor (BJT), e.g., PNP BJT 102 shown in FIG. 1, that can be used as an access device in a resistance variable memory cell according to one or more embodiments of the present disclosure. The forward bias characteristics of the PNP BJT are shown on the left side of graph 200, and the reverse bias characteristics of the PNP BJT are shown on the right side of graph 200. The black squares represent the emitter current of the PNP BJT for a given forward bias voltage, and the white squares represent the base current of the PNP BJT for a given forward or reverse bias voltage. The circled areas of the current-voltage curves represent programming regions for resistance variable memory cells in accordance with one or more embodiments of the present disclosure.

The reverse bias current illustrated by graph 200 corresponds to the leakage current previously described in connection with FIG. 1. That is, the right side of graph 200 shows the relationship between reverse bias voltage and leakage current of a PNP BIT that can be used as an access device in a resistance variable memory cell that is part of a resistance variable memory array, e.g., array 100 shown in FIG. 1, that can undergo one or more programming operations described in connection with FIG. 1. The leakage current is shown on a logarithmic scale. As illustrated by the reverse bias curve in graph 200, the leakage current of the resistance variable memory cell, e.g., the PNP RFT used as an access device for the resistance variable memory cell, has an exponential dependence on the reverse bias voltage of the memory cell. That is, lowering the reverse bias voltage of a memory cell that has a large reverse bias voltage during a programming operation, e.g., a memory cell that is not coupled to either the written bit line or the written word line, can result in an exponential decrease in the leakage current across the memory device. For example, achieving a reduction in the reverse bias voltage by approximately a few tenths of a volt can reduce the leakage current across the memory device by approximately half. Such an exponential decrease in leakage current can result in an exponential decrease in the amount of current consumed by the memory device during the programming operation.

Although graph 200 illustrates a reverse bias curve associated with a PNP BIT access device, other access devices, e.g., NPN BJTs, diodes, and/or MOSFETs, can have similar reverse bias curves. That is, the leakage current of a resistance variable memory cell which uses an NPN BIT, a diode, and/or a MOSFET as an access device can also have an exponential dependence on the reverse bias voltage of the memory cell.

Figure 3:
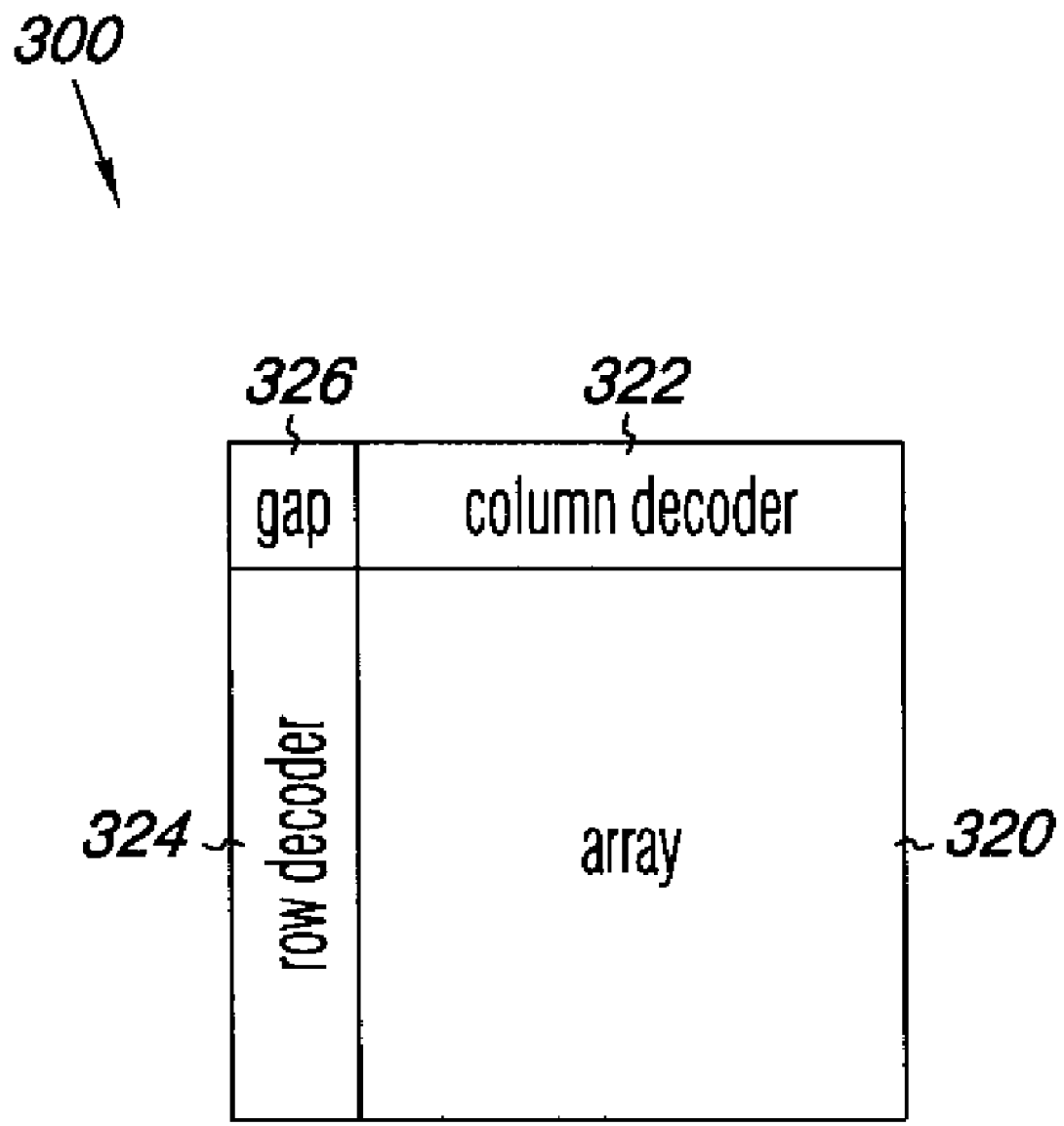
FIG. 3 is a functional block diagram of a portion of a memory device in accordance with one or more embodiments of the present disclosure.

FIG. 3 is a functional block diagram of a portion of a memory device 300 in accordance with one or more embodiments of the present disclosure. In the embodiment illustrated in FIG. 3, memory device 300 includes memory array 320, column decoder 322, row decoder 324, and gap 326. As will be appreciated by one of ordinary skill in the art, memory device 300 can also include additional components and/or circuitry which have not been shown in FIG. 3 so as not to obscure one or more embodiments of the present disclosure.

In one or more embodiments, memory array 320 can be a resistance variable memory array. In one or more embodiments, memory array 320 can be a resistance variable memory array analogous to array 100 described previously in connection with FIG. 1. In one or more embodiments, column decoder 322 and row decoder 324 can receive and decode memory address signals to access the corresponding memory locations in the memory array, e.g., array 320.

In the embodiment illustrated in FIG. 3, row decoder 324 is connected to a first side of memory array 320, and column decoder 322 is connected to a second side of memory array 320 that is adjacent to the first side. Although column decoder 322 and row decoder 324 are shown as being physically connected to memory array 320 in the embodiment illustrated in FIG. 3, embodiments of the present disclosure are not so limited, and may include embodiments in which the column decoder and/or row decoder are physically separated from, but electrically connected to, the array. That is, the term "connected," as used herein, can include a physical connection and/or an electrical connection.

In the embodiment illustrated in FIG. 3, memory device 300 includes a gap 326 located adjacent to column decoder 322 and row decoder 324. In one or more embodiments, gap 326 can include clamp circuitry selectively coupled to bit lines associated with memory array 320. The clamp circuitry can also be configured to control a reverse bias voltage associated with one or more unselected memory cells, e.g., any memory cell that is not coupled to either the written bit line or the written word line, during a programming operation of memory array 320. Such clamp circuitry will be described further in connection with FIGS. 6-8.

Figure 4:
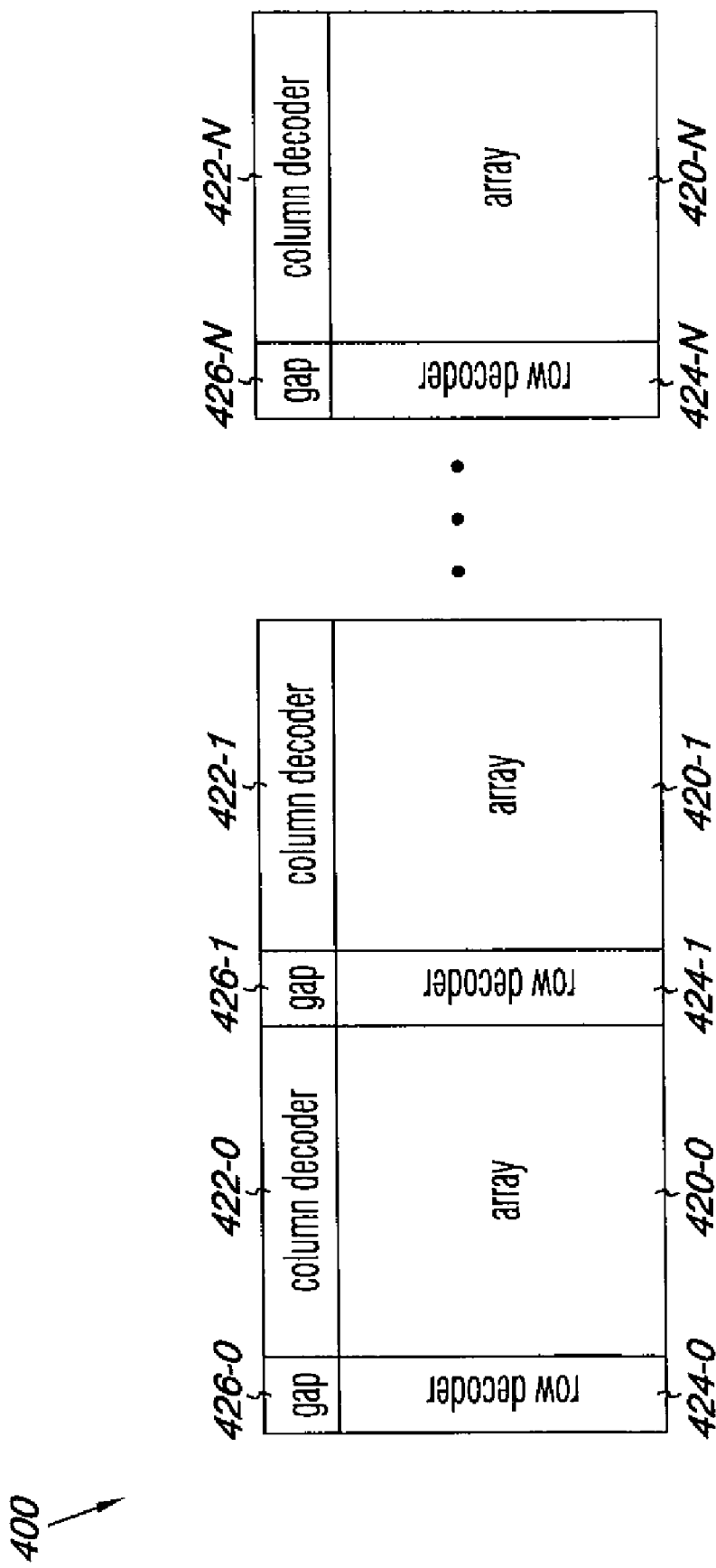
FIG. 4 is a functional block diagram of a portion of a memory device in accordance with one or more embodiments of the present disclosure.

FIG. 4 is a functional block diagram of a portion of a memory device 400 in accordance with one or more embodiments of the present disclosure. In the embodiment illustrated in FIG. 4, memory device 400 includes memory arrays 420-0, 420-1, ..., 420-N, column decoders 422-0, 422-1, ..., 422-N, row decoders 424-0, 424-1, ..., 424-N, and gaps 426-0, 426-1, ..., 426-N. The designator "N" is used to indicate that memory device 400 can include a number of memory arrays, column decoders, row decoders, and/or gaps. As will be appreciated by one of ordinary skill in the art, memory device 400 can also include additional components and/or circuitry which have not been shown in FIG. 4 so as not to obscure one or more embodiments of the present disclosure.

In one or more embodiments, memory arrays 420-0, 420-1, ..., 420-N, can be resistance variable memory arrays. In one or more embodiments, the memory arrays can be resistance variable memory arrays analogous to array 100 described previously in connection with FIG. 1. In one or more embodiments, column decoders 422-0, 422-1, ..., 422-N, and row decoders 424-0, 424-1, ..., 424-N, can receive and decode memory address signals to access the corresponding memory locations in the memory arrays.

In the embodiment illustrated in FIG. 4, each row decoder 424-0, 424-1, ..., 424-N, is connected to a first side of an associated memory array 420-0, 420-1, ..., 420-N, and each column decoder 424-0, 424-1, ..., 424-N, is connected to a second side of an associated memory array 420-0, 420-1, ..., 420-N, that is adjacent to the first side. Although the column decoders and row decoders are shown as being physically connected to the memory arrays in the embodiment illustrated in FIG. 4, embodiments of the present disclosure are not so limited, as previously described in connection with FIG. 3.

In the embodiment illustrated in FIG. 4, memory device 400 includes gaps 426-0, 426-1, ..., 426-N, located adjacent to column decoders 422-0, 422-1, ..., 422-N, and row decoders 424-0, 424-1, ..., 424-N, respectively. In one or more embodiments, gaps 426-0, 426-1, ..., 426-N, can include clamp circuitry selectively coupled to bit lines associated with memory arrays 420-0, 420-1, ..., 420-N, respectively. The clamp circuitry can also be configured to control a reverse bias voltage associated with one or more unselected memory cells, e.g., any memory cell that is not coupled to either the written bit line or the written word line, during a programming operation of the memory arrays. Such clamp circuitry will be described further in connection with FIGS. 6-8.

In one or more embodiments, the clamp circuitry located in a gap can be selectively coupled to bit lines associated with multiple memory arrays. For example, the clamp circuitry located in gap 426-1 can be selectively coupled to bit lines associated with memory array 420-0, and can also be selectively coupled to bit lines associated with memory array 420-1. In one or more embodiments, the clamp circuitry located in a gap can be selectively coupled to a number of bit lines associated with a first memory array, and can be selectively coupled to an equal number of bit lines associated with a second memory array. For example, the clamp circuitry located in gap 426-1 can be selectively coupled to 500 bit lines associated with memory array 420-0, and can be selectively coupled to 500 bit lines associated with memory array 420-1. However, embodiments of the present disclosure are not limited to these examples. Selectively coupling the clamp circuitry located in a gap to bit lines associated with multiple arrays can decrease the distance between the clamp circuitry and the bit lines to which the clamp circuitry is selectively coupled, which can decrease the length and/or amount of circuitry required to selectively couple the clamp circuitry to the bit lines.

Figure 5:
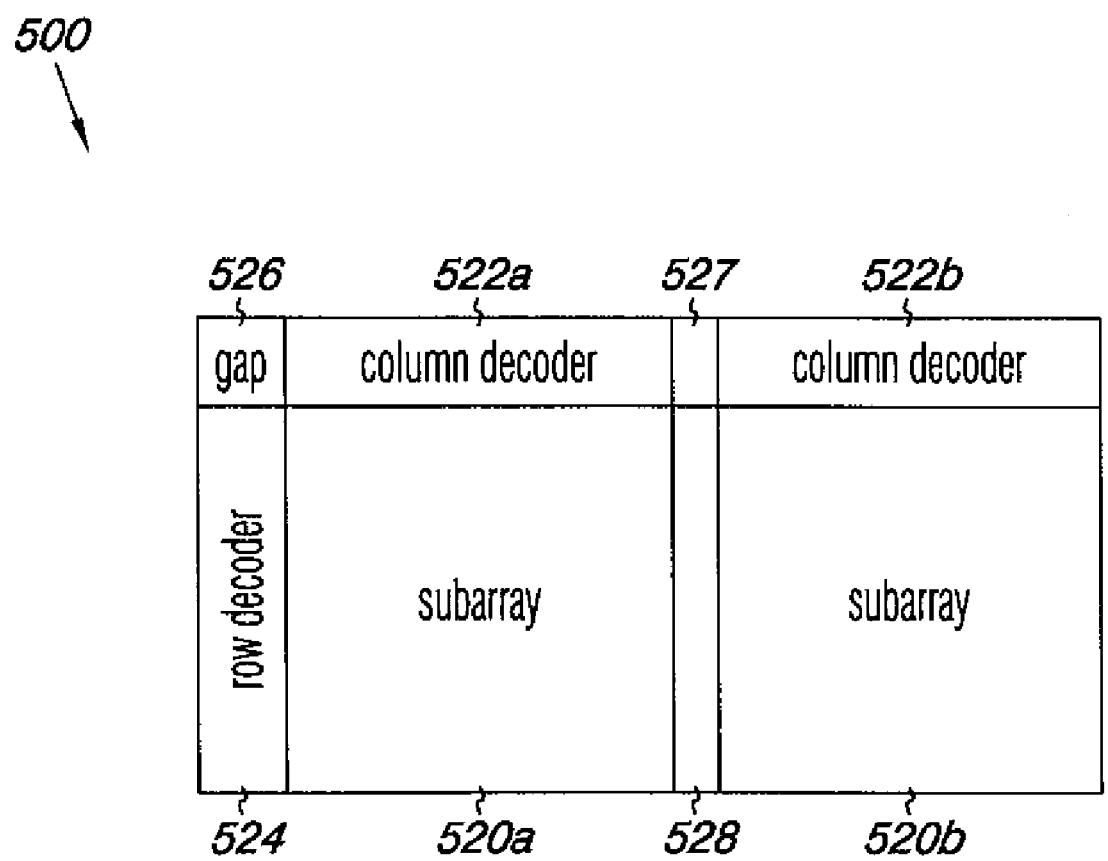
FIG. 5 is a functional block diagram of a portion of a memory device in accordance with one or more embodiments of the present disclosure.

FIG. 5 is a functional block diagram of a portion of a memory device 500 in accordance with one or more embodiments of the present disclosure. In the embodiment illustrated in FIG. 5, memory device 500 includes a memory array that has been divided into subarrays 520a and 520b. The designators "a" and "b" are used to indicate that each subarray, e.g., 520a and 520b, is a portion of, e.g., originated from, a single memory array. Although the embodiment illustrated in FIG. 5 shows a memory array that has been divided into two subarrays, embodiments of the present disclosure are not so limited, and can include memory arrays that have been divided into any number of subarrays.

In one or more embodiments, subarrays 520a and 520b can be portions of a resistance variable memory array. In one or more embodiments, subarrays 520a and 520b can be portions of a resistance variable memory array analogous to array 100 described previously in connection with FIG. 1.

The embodiment illustrated in FIG. 5 also includes a row decoder 524 and a column decoder that has been divided into portions 522a and 522b. Portion 522a is associated with subarray 520a, and portion 522b is associated with subarray 520b. In one or more embodiments, the column decoder and row decoder can receive and decode memory address signals to access the corresponding memory locations in the subarrays, e.g., subarrays 520*a* and 520*b*. As shown in FIG. 5, column decoder portions 522*a* and 522*b* can be separated by space 527.

In the embodiment illustrated in FIG. 5, row decoder 524 is connected to a first side of subarray 520*a*, and column decoder portions 522*a* and 522*b* are connected to a second side of subarrays 520*a* and 520*b* that is adjacent to the first side. Although row decoder 524 and column decoder portions 522*a* and 522*b* are shown as being physically connected to subarrays 520*a* and 520*b* in the embodiment illustrated in FIG. 5, embodiments of the present disclosure are not so limited, as previously described in connection with FIG. 3.

The embodiment illustrated in FIG. 5 also includes a gap 526 located adjacent to column decoder portion 522*a* and row decoder 524. In one or more embodiments, gap 526 and/or space 527 can include clamp circuitry selectively coupled to bit lines associated with subarray 520*a* and/or subarray 520*b*. The clamp circuitry can also be configured to control a reverse bias voltage associated with one or more unselected memory cells, e.g., any memory cell that is not coupled to either the written bit line or the written word line, during a programming operation of subarray 520*a* and/or subarray 520*b*. Such clamp circuitry will be described further in connection with FIGS. 6-8.

In the embodiment illustrated in FIG. 5, subarrays 520*a* and 520*b* are separated by area 528. In the embodiment illustrated in FIG. 5, area 528 is adjacent to space 527. In one or more embodiments, area 528 can contain additional circuitry for use in operating subarray 520*a* and or subarray 520*b*. The additional circuitry can include, for example, sensing circuitry, e.g., one or more sense amplifiers, and/or row decoders, among other circuitry.

In one or more embodiments, memory device 500 can also include additional components and/or circuitry, as will be understood by one of ordinary skill in the art. Such additional components and/or circuitry have not been shown in FIG. 5 so as not to obscure one or more embodiments of the present disclosure.

Figure 6:
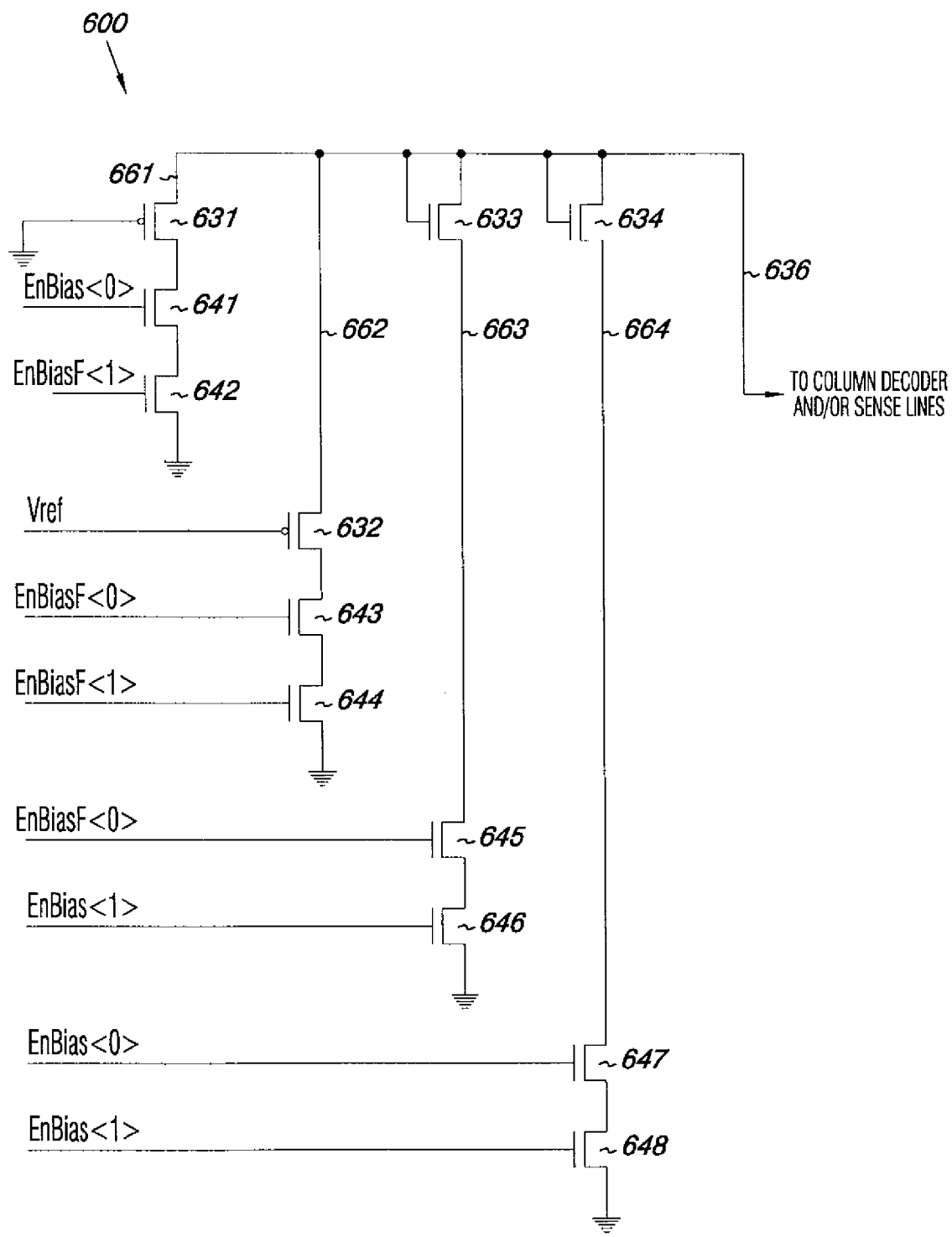
FIG. 6 is a schematic illustrating a portion of clamp circuitry in accordance with one or more embodiments of the present disclosure.

FIG. 6 is a schematic illustrating a portion of clamp circuitry 600 in accordance with one or more embodiments of the present disclosure. Clamp circuitry 600 can be used to control a reverse bias voltage associated with one or more unselected memory cells, e.g., any memory cell that is not coupled to either the written bit line or the written word line, during a programming, e.g., writing, operation of resistance variable memory cells, arrays, and/or devices. However, embodiments of the present disclosure are not limited to the particular clamp circuitry shown in FIG. 6, and can include other clamp circuitry configurations which can be used to control a reverse bias voltage associated with one or more unselected memory cells during a programming operation of resistance variable memory cells, arrays, and/or devices.

In the embodiment illustrated in FIG. 6, clamp circuitry 600 includes four selectable paths, e.g., paths 661, 662, 663, and 664, wherein each path can control a reverse bias voltage associated with one or more unselected memory cells during a programming operation of resistance variable memory cells, arrays, and/or devices. In one or more embodiments, one or more of the paths can act as a source follower. A first path, e.g., path 661, can include a p-channel metal oxide semiconductor (PMOS) transistor 631 having its gate connected to ground. A second path, e.g., path 662, can include a PMOS transistor 632 having its gate connected to an input reference voltage, e.g., $V_{ref}$. A third path, e.g., path 663, can include an n-channel metal oxide semiconductor (NMOS) transistor 633. A fourth path, e.g., path 664, can include NMOS transistor 634. However, embodiments of the present disclosure are not limited to the paths shown in FIG. 6, and can include other selectable paths configured to control a reverse bias voltage associated with one or more unselected memory cells during a programming operation.

In one or more embodiments, NMOS transistor 633 can be a thick oxide diode connected NMOS transistor, and NMOS transistor 634 can be a thin oxide diode connected NMOS transistor. A thick oxide diode connected NMOS has a relatively thicker oxide layer than a thin oxide diode connected NMOS. For example, in one embodiment, the oxide layer of thick oxide diode connected NMOS transistor 633 can be two times thicker than the oxide layer of thin oxide diode connected NMOS transistor 634. In another embodiment, the oxide layer of thick oxide diode connected NMOS transistor 633 can be three times thicker than the oxide layer of thin oxide diode connected NMOS transistor 634. However, embodiments of the present disclosure are not limited to the preceding examples. Further, as will be appreciated by one of ordinary skill in the art, the thickness of the oxide layer of a transistor depends on the process used to fabricate the transistor. Hence, the defining dimensions for thick oxide diode connected NMOS transistor 633 and thin oxide diode connected transistor 634 can depend on the process used to fabricate the transistors.

Each selectable path shown in the embodiment illustrated in FIG. 6 includes NMOS transistors coupled to selection logic, e.g., EnBias<0:1> and/or EnBiasF<0:1> signals. The first path, e.g., path 661, can include NMOS transistors 641 and 642, wherein NMOS transistor 641 can be coupled to an EnBias<0> signal and NMOS transistor 642 can be coupled to an EnBiasF<1> signal. The second path, e.g., path 662, can include NMOS transistors 643 and 644, wherein NMOS transistor 643 can be coupled to an EnBiasF<0> signal and NMOS transistor 644 can be coupled to an EnBiasF<1> signal. The third path, e.g., path 663, can include NMOS transistors 645 and 646, wherein NMOS transistor 645 can be coupled to an EnBiasF<0> signal and NMOS transistor 646 can be coupled to an EnBias<1> signal. The fourth path, e.g., path 664, can include NMOS transistors 647 and 648, wherein NMOS transistor 647 can be coupled to an EnBias<0> signal and NMOS transistor 648 can be coupled to an EnBias<1> signal.

In the embodiment illustrated in FIG. 6, clamp circuitry 600 includes pull down line 636. As shown in FIG. 6, each selectable path of clamp circuitry 600, e.g., paths 661, 662, 663, and 664, can be coupled to pull down line 636. Pull down line 636 can also be selectively coupled to one or more bit lines, e.g., bit lines 107-0, 107-1, . . . , 107-M shown in FIG. 1, of a resistance variable memory array, e.g., array 100 shown in FIG. 1 (not shown in FIG. 6). That is, in one or more embodiments, each selectable path of clamp circuitry 600 can be selectively coupled to the one or more bit lines of the array via pull down line 636. In one or more embodiments, pull down line 636 can be selectively coupled to the one or more bit lines by circuitry located in a column decoder that is connected to the resistance variable memory array. The pull down line, and selectively coupling the one or more bit lines to the pull down line, will be described further in connection with FIG. 7.

In one or more embodiments, clamp circuitry 600 can be located in a gap, e.g., gap 326 shown in FIG. 3, gaps 426-0, 426-1, . . . , 426-N shown in FIG. 4, and/or gap 526 shown in FIG. 5, located adjacent to a row decoder connected to a first side of a resistance variable memory array and a column decoder connected to a second side of the resistance variable memory array, as previously described in connection with FIGS. 3-5. Since this gap can already be present in the memory device, locating the clamp circuitry in the gap does not increase the size and/or layout area of the memory device. Additionally, because this gap is easily accessible, locating the clamp circuitry in this gap can make it easier to make changes to the clamp circuitry during the development process of the memory device, should the need to do so arise. Further, locating the clamp circuitry in this gap can enable the clamp circuitry to be used with multiple bit lines associated with an array, rather than requiring individual clamp circuitries for each individual bit line. For example, in one or more embodiments, each bit line associated with an array can be selectively coupled to one particular clamp circuitry, e.g., clamp circuitry 600. Additionally, locating the clamp circuitry in this gap can minimize the length between the clamp circuitry and the bit lines. That is, locating the clamp circuitry can minimize the length of pull down line 626, which can minimize the voltage drop along the pull down line and ensure a more predictable reverse bias voltage.

In one or more embodiments, clamp circuitry 600 can be located in multiple gaps, e.g., gaps 426-0, 426-1, ..., 426-N shown in FIG. 4, located adjacent to the row and column decoders of multiple resistance variable memory arrays, as previously described in connection with FIG. 4. In one or more embodiments, the clamp circuitry located in a particular gap can be selectively coupled to bit lines associated with multiple arrays, as previously described in connection with FIG. 4. In one or more embodiments, the clamp circuitry located in different gaps can include one or more different selectable paths and/or have one or more selectable paths in common. For example, with reference to FIGS. 4 and 6, gap 426-0 can include a first path, for example, path 661, gap 426-1 can include a second path, for example, path 662, etc. As a second example, gap 426-0 can include a first path, for example, path 662, and a second path, for example, path 664, gap 426-1 can include a third path, for example, path 663, and a fourth path that is the same as one of the paths located in gap 426-0, for example, path 664, etc. However, embodiments of the present disclosure are not limited to the preceding examples.

In one or more embodiments, clamp circuitry 600 can be located in one or more spaces, e.g., space 527 shown in FIG. 5, in a column decoder associated with a resistance variable memory array that has been divided into one or more subarrays, as previously described in connection with FIG. 5. Locating the clamp circuitry in the one or more spaces can provide advantages analogous to those previously described herein with respect to locating the clamp circuitry in the gap. In one or more embodiments, the clamp circuitry located in different spaces can include one or more different selectable paths and/or have one or more selectable paths in common in a manner analogous to that previously described herein with respect to the clamp circuitry located in different gaps.

In one or more embodiments, one or more of the selectable paths of clamp circuitry 600, e.g., paths 661, 662, 663, and 664, can be dynamically selected, e.g., selected during a programming operation, by switching the EnBias<0:1> and/or EnBiasF<0:1> signals, as will be appreciated by one of ordinary skill in the art. The one or more selected paths can be selectively coupled to the one or more bit lines associated with a resistance variable memory array via pull down line 636 in order to control a reverse bias voltage associated with one or more unselected memory cells during a programming operation of the array. Selectively coupling the selected paths to the one or more bit lines will be described further in connection with FIG. 7.

In one or more embodiments, clamp circuitry 600 can control a reverse bias voltage associated with the one or more unselected memory cells by pulling the bit lines to which the one or more unselected memory cells are coupled to a selected voltage. In one or more embodiments, the selected voltage to which the bit lines to which the one or more unselected memory cells are coupled are pulled can depend on the path that is selected. That is, the different selectable paths of clamp circuitry 600, e.g., paths 661, 662, 663, and 664, can pull the bit lines to different voltages. For example, the first path, e.g., path 661, can pull the bit lines to approximately one PMOS transistor threshold voltage ($V_t$) above ground, the second path, e.g., path 662, can pull the bit lines to approximately one PMOS transistor $V_t$ above a reference voltage, e.g., $V_{ref}$, applied to the gate of the transistor, the third path, e.g., path 663, can pull the bit lines to approximately one thick oxide diode connected NMOS transistor $V_t$ above ground, and the fourth path, e.g., path 664, can pull the bit lines to approximately one thin oxide diode connected NMOS transistor $V_t$ above ground. However, embodiments of the present disclosure are not limited to the preceding example, and can include other selectable paths which can pull the bit lines to other voltages. As used herein, threshold voltage ($V_t$) means the gate voltage at which the channel of the transistor beings to form, as will be understood by one of ordinary skill in the art. That is, a PMOS transistor $V_t$ is the gate voltage at which the channel of the PMOS transistor beings to form, a thick oxide diode connected NMOS transistor $V_t$ is the gate voltage at which the channel of the thick oxide diode connected NMOS transistor begins to form, and a thin oxide diode connected NMOS transistor $V_t$ is the gate voltage at which the channel of the thin oxide diode connected NMOS transistor beings to form.

In one or more embodiments, the reference voltage, e.g., $V_{ref}$, can be changed during the programming operation to provide a particular reverse bias voltage. That is, in one or more embodiments, different reference voltages can be sequentially applied to the gate of PMOS transistor 632, and the second path, e.g., path 662, can sequentially pull the bit lines to approximately one PMOS transistor $V_t$ above each reference voltage in order to provide a particular reverse bias voltage.

In one or more embodiments, clamp circuitry 600 can control a reverse bias voltage associated with the one or more unselected memory cells within a range of approximately 100 millivolts. In one or more embodiments, the clamp circuitry can reduce the reverse bias voltage by at least 500 millivolts, as compared to the reverse bias voltage when the one or more unselected memory cells are held near ground. In one or more embodiments, the clamp circuitry can reduce the reverse bias voltage within a range of approximately 500 millivolts to 800 millivolts, as compared to the reverse bias voltage when the one or more unselected memory cells are held near ground.

Figure 7:
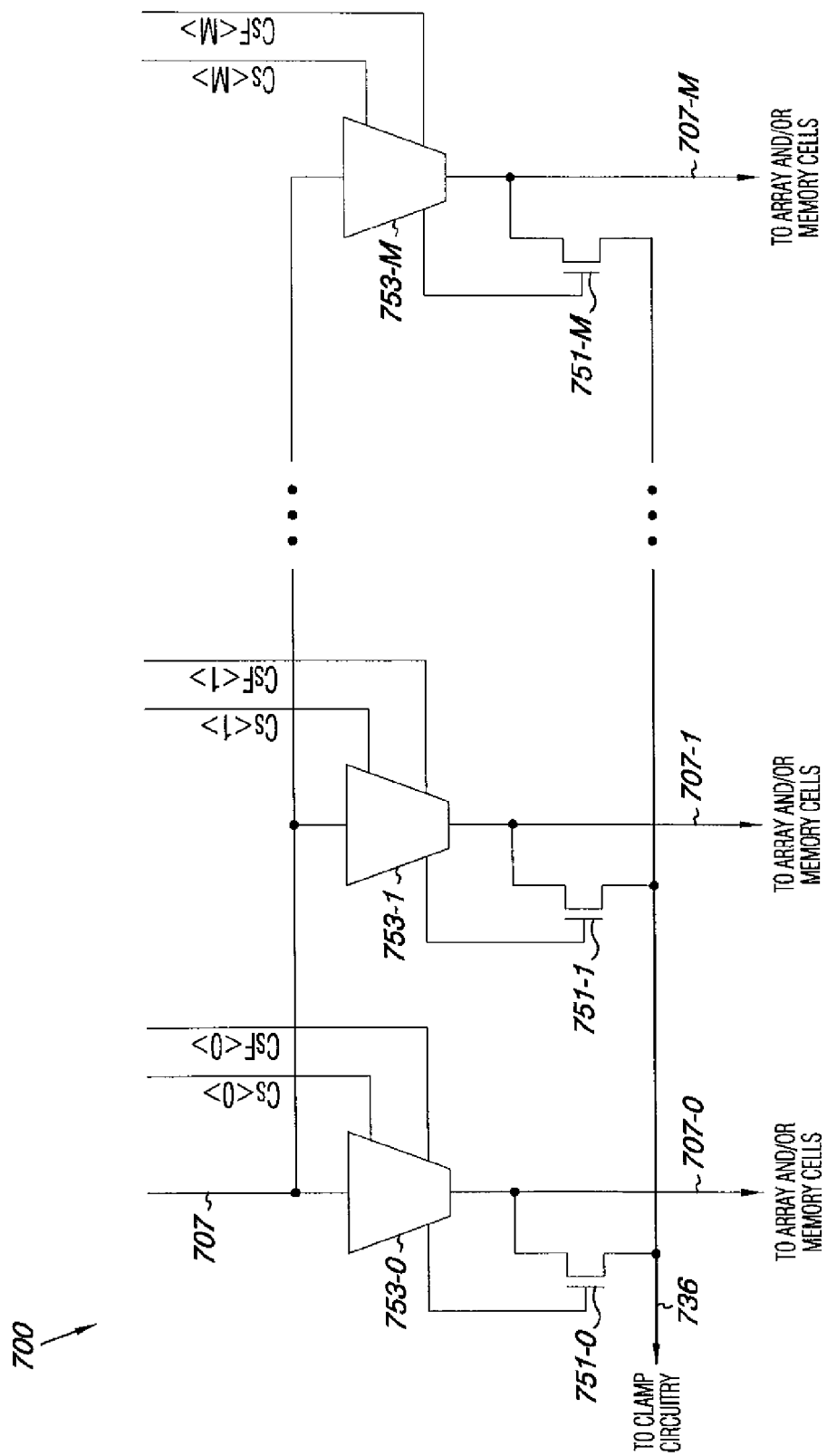
FIG. 7 is a schematic illustrating a portion of column decoder circuitry in accordance with one or more embodiments of the present disclosure.

FIG. 7 is a schematic illustrating a portion of column decoder circuitry 700 in accordance with one or more embodiments of the present disclosure. Column decoder circuitry 700 can be used to selectively couple one or more bit lines, e.g., bit lines 107-0, 107-1, ..., 107-M shown in FIG. 1, associated with a resistance variable memory array, e.g., array 100 shown in FIG. 1, to clamp circuitry, e.g., clamp circuitry 600 shown in FIG. 6. However, embodiments of the present disclosure are not limited to the particular column decoder circuitry shown in FIG. 7, and can include other circuitry and/or devices configured to selectively couple the one or more bit lines to clamp circuitry.

In one or more embodiments, column decoder circuitry 700 can be located in a column decoder, e.g., column decoder 322 shown in FIG. 3, column decoders 422-0, 422-1, ..., 422-N shown in FIG. 4, and/or column decoder portions 522a and 522b shown in FIG. 5, that is connected to a resistance variable memory array. However, embodiments of the present disclosure are not so limited, and can include embodiments in which circuitry 700 is located elsewhere in a resistance variable memory device. Further, as will be recognized by one of ordinary skill in the art, the column decoder in which circuitry 700 can be located can also include additional components and/or circuitry which have not been shown in FIG. 7 so as not to obscure one or more embodiments of the present disclosure.

In the embodiment illustrated in FIG. 7, column decoder circuitry 700 includes global bit line 707 which can be split into bit lines 707-0, 707-1, ..., 707-M. Circuitry 700 also includes pass transistors 751-0, 751-1, ..., 751-M, and multiplexers 753-0, 753-1, ..., 753-M. The designator "M" is used to indicate that column decoder circuitry 700 can include a number of bit lines, pass transistors, and/or multiplexers. Circuitry 700 also includes pull down line 736.

As shown in FIG. 7, bit line 707-0 can pass through multiplexer 753-0, bit line 707-1 can pass through multiplexer 753-1, and bit line 707-M can pass through multiplexer 753-M. In one or more embodiments, the bit lines can also be coupled to resistance variable memory cells located in a resistance variable memory array, e.g., array 100 shown in FIG. 1 (not shown in FIG. 7). As shown in FIG. 7, each bit line can also be coupled to a pass transistor, e.g., 751-0, 751-1, ..., 751-M.

As shown in FIG. 7, logic signals Cs<0> and CsF<0> can be coupled to multiplexer 753-0, logic signals Cs<1> and CsF<1> can be coupled to multiplexer 753-1, and logic signals Cs<M> and CsF<M> can be coupled to multiplexer 753-M. As shown in FIG. 7, multiplexer 753-0 can be coupled to pass transistor 751-0, multiplexer 753-1 can be coupled to pass transistor 751-1, and multiplexer 753-M can be coupled to pass transistor 751-M. As shown in FIG. 7, the pass transistors can be coupled to pull down line 736.

In one or more embodiments, the Cs and CsF logic signals can be used to turn the pass transistors on and/or off, as will be understood by one of ordinary skill in the art. Turning a pass transistor on can couple the bit line to which the pass transistor is coupled to pull down line 736. For example, bit line 707-0 can be coupled to pull down line 736 by turning on pass transistor 751-0. If, however, the pass transistor is turned off, the bit line to which the pass transistor is coupled will not be coupled to the pull down line.

In one or more embodiments, pull down line 736 can be coupled to clamp circuitry, e.g., clamp circuitry 600 shown in FIG. 6. Hence, in one or more embodiments, turning on pass transistors 751-0, 751-1, ..., 751-M can couple bit lines 707-0, 707-1, ..., 707-M to the clamp circuitry, e.g., clamp circuitry 600 shown in FIG. 6.

In one or more embodiments, the logic signals can be used selectively turn on one or more of the pass transistors. That is, in one or more embodiments, the bit lines can be selectively coupled to the clamp circuitry. For example, during a programming operation, one or more bit lines to which unselected memory cells are coupled can be selectively coupled to the clamp circuitry by turning on only the pass transistors coupled to the one or more bit lines. For example, during a programming operation in which a memory cell coupled to bit line 707-1 is to be programmed, bit lines 707-0 and 707-M can be selectively coupled to the clamp circuitry by turning on pass transistors 751-0 and 751-M. However, embodiments of the present disclosure are not limited to this example.

Figure 8:
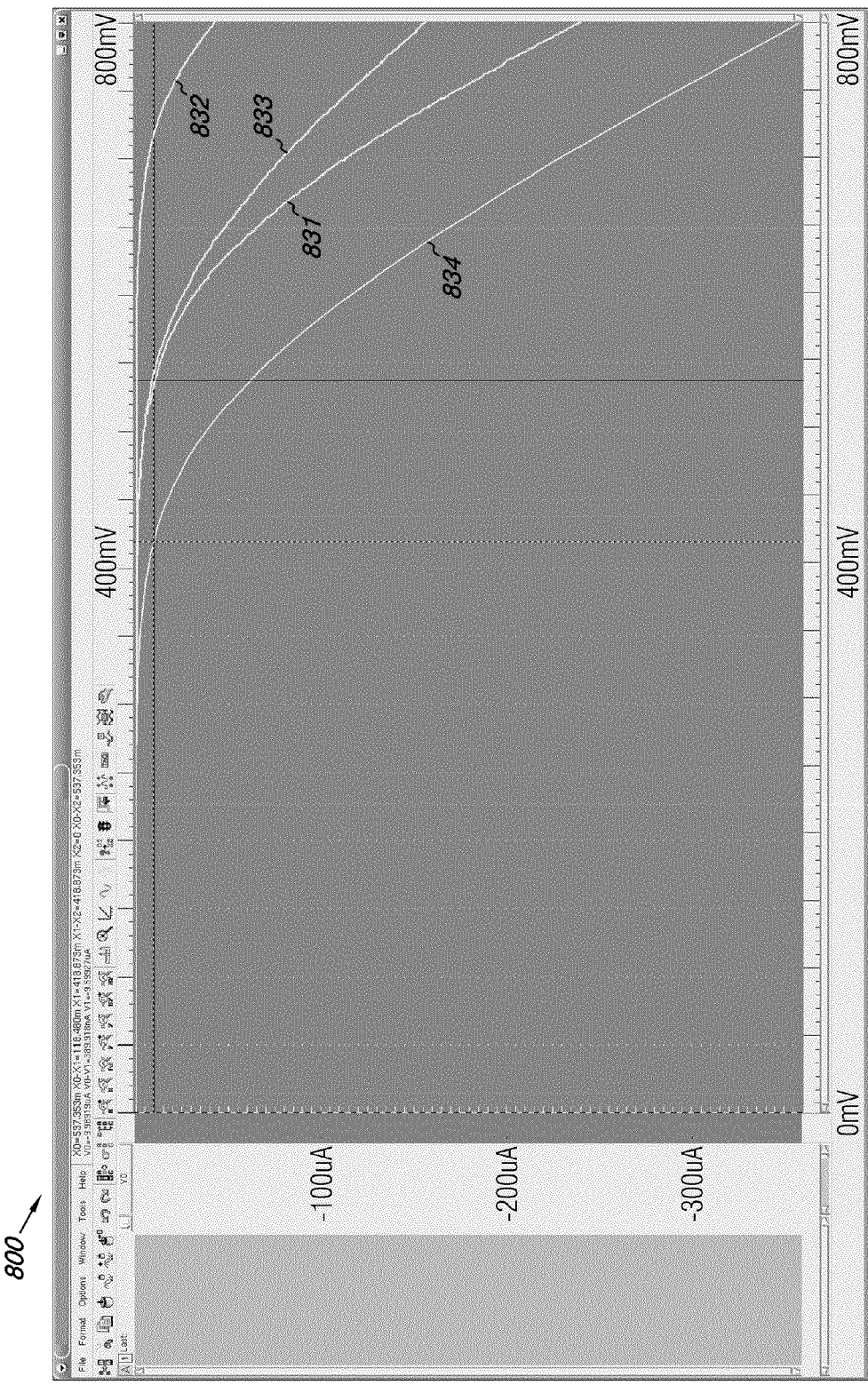
FIG. 8 is a graph illustrating the current-voltage characteristics of the four selectable paths illustrated in FIG. 6 during a programming operation that is in accordance with one or more embodiments of the present disclosure.

FIG. 8 is a graph 800 illustrating the current-voltage characteristics of the four selectable paths illustrated in FIG. 6, e.g., paths 661, 662, 663, and 664, during a simulation of a programming operation utilizing clamp circuitry 600 and column decoder 700 in accordance with one or more embodiments of the present disclosure. The horizontal axis of graph 800 represents voltage from 0 to 800 millivolts on a linear scale, and the vertical axis of graph 800 represents current from 0 to −360 microamps on a linear scale. Voltage is shown in millivolts on the x-axis of graph 800, and current is shown in microamps on the y-axis of graph 800. Curve 831 represents the current-voltage characteristics of the first path, e.g., path 661, curve 832 represents the current-voltage characteristics of the second path, e.g., path 662, curve 833 represents the current-voltage characteristics of the third path, e.g., path 663, and curve 834 represents the current-voltage characteristics of the fourth path, e.g., path 664, wherein NMOS transistor 633 is a thick oxide diode connected NMOS transistor, and NMOS transistor 634 is a thin oxide diode connected NMOS transistor.

During the simulation of the programming operation that produced graph 800, the pull down line, e.g., pull down line 636 and/or 736, was swept from 0 to 800 millivolts. Also, a reference voltage of 200 millivolts was applied to the gate of PMOS transistor 632, and the gate of PMOS transistor 631 was grounded, e.g., no voltage was applied to the gate of PMOS transistor 631. As a result, the leakage current that occurred on the second path, e.g., path 662, occurred at approximately 170 millivolts higher than the leakage current that occurred on the first path, e.g., path 661, as illustrated in graph 800. That is, the leakage current that occurred on the first path, e.g., path 661, occurred at a voltage of approximately 540 millivolts, and the leakage current that occurred on the second path, e.g., path 662, occurred at a voltage of approximately 710 millivolts, as illustrated in graph 800.

In one or more embodiments, the reference voltage applied to the gate of PMOS transistor 632 can be sequentially changed in order to provide a particular reverse bias voltage, hence reducing the leakage during the programming operation, as previously described in connection with FIG. 6. For example, in the simulation programming operation that produced graph 800, the reference voltage could be increased to 300 millivolts, which would provide a reverse bias voltage of approximately 810 millivolts. Alternatively, the reference voltage could be decreased to 100 millivolts, which would provide a reverse bias voltage of approximately 610 millivolts.

Figure 9:
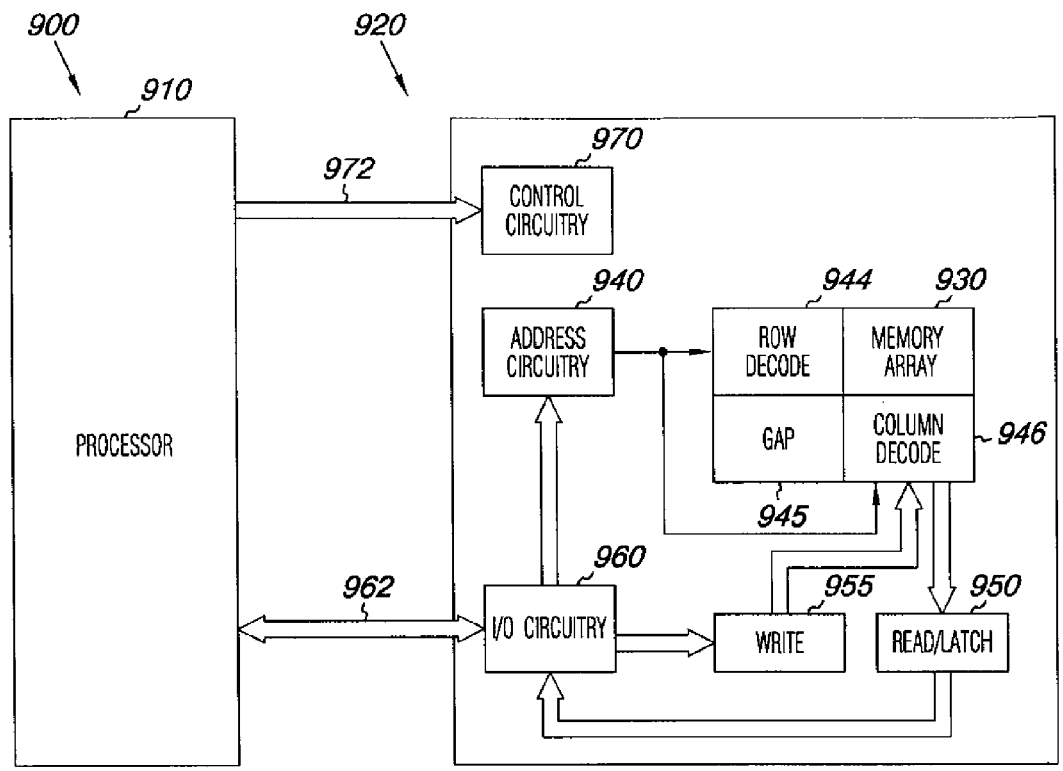
FIG. 9 is a functional block diagram of an electronic memory system having at least one memory device in accordance with one or more embodiments of the present disclosure.

FIG. 9 is a functional block diagram of an electronic memory system 900 having at least one memory device 920 in accordance with one or more embodiments of the present disclosure. Memory system 900 can include a processor 910 coupled to a memory device 920 that can include a memory array 930 of memory cells. The memory system 900 can include separate integrated circuits or both the processor 910 and the memory device 920 can be on the same integrated circuit. The processor 910 can be a microprocessor or some other type of controlling circuitry such as an application-specific integrated circuit (ASIC).

The memory device 920 can include an array of memory cells 930, which can be resistance variable memory cells with a PCRAM architecture, for example. In one or more embodiments, memory array 930 can be analogous to array 100 previously described in connection with FIG. 1. The embodiment of FIG. 9 includes address circuitry 940 to latch address signals provided over I/O connections 962 through I/O circuitry 960. Address signals can be received and decoded by a row decoder 944 and a column decoder 946 to access the memory array 930. It will be appreciated by those skilled in the art that the number of address input connections can depend on the density and architecture of the memory array 930 and that the number of addresses can increase with both increased numbers of memory cells and increased numbers of memory blocks and arrays.

The memory array 930 can include multilevel memory cells having different numbers of programmed levels, sensing references, etc., according to embodiments described herein. The read/latch circuitry 950 can read and latch a page or row of data from the memory array 930. I/O circuitry 960 can be included for bi-directional data communication over the 110 connections 962 with the processor 910. Write circuitry 955 can be included to write data to the memory array 930.

Gap 945 can be located adjacent to row decoder 944 and column decoder 946. In one or more embodiments, gap 945 can contain clamp circuitry configured to control a reverse bias voltage associated with one or more unselected cells of memory array 930 during a programming operation in accordance with one or more embodiments of the present disclosure.

Control circuitry 970 can decode signals provided by control connections 972 from the processor 910. These signals can include chip signals, write enable signals, and address latch signals that are used to control the operations on the memory array 930, including data sensing, data write, and data erase operations. In one or more embodiments, the control circuitry 970 can be responsible for executing instructions from the processor 910 to perform the operations according to embodiments of the present disclosure. The control circuitry 970 can be a state machine, a sequencer, or some other type of controller. It will be appreciated by those skilled in the art that additional circuitry and control signals can be provided, and that the memory device detail of FIG. 9 has been reduced so as not to obscure one or more embodiments of the present disclosure.

Figure 10:
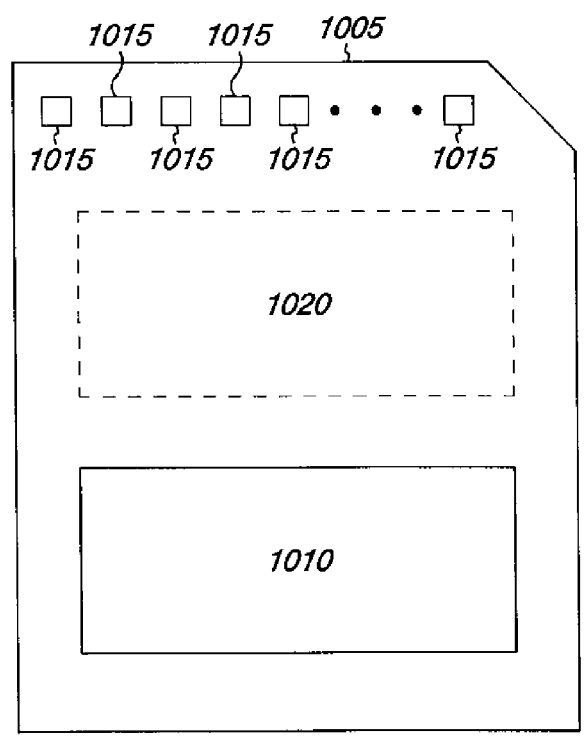
FIG. 10 is a functional block diagram of a memory module having at least one memory device in accordance with one or more embodiments of the present disclosure.

FIG. 10 is a functional block diagram of a memory module 1000 having at least one memory device 1010 in accordance with one or more embodiments of the present disclosure. Memory module 1000 is illustrated as a memory card, although the concepts discussed with reference to memory module 1000 are applicable to other types of removable or portable memory (e.g., USB interface drives) and are intended to be within the scope of "memory module" as used herein. In addition, although one example form factor is depicted in FIG. 10, these concepts are applicable to other form factors as well.

In one or more embodiments, memory module 1000 can include a housing 1005 (as depicted) to enclose one or more memory devices 1010, though such a housing is not essential to all devices or device applications. At least one memory device 1010 can include an array of multilevel memory cells that can be programmed and/or sensed according to embodiments described herein. Where present, the housing 1005 includes one or more contacts 1015 for communication with a host device. Examples of host devices include digital cameras, digital recording and playback devices, PDAs, personal computers, memory card readers, interface hubs and the like. For one or more embodiments, the contacts 1015 are in the form of a standardized interface. For example, with a USB interface drive, the contacts 1015 might be in the form of a USB Type-A male connector. In general, contacts 1015 can provide an interface for passing control, address and/or data signals between the memory module 1000 and a host having compatible receptors for the contacts 1015.

The memory module 1000 may optionally include additional circuitry 1020, which may be one or more integrated circuits and/or discrete components. For one or more embodiments, the additional circuitry 1020 may include control circuitry, such as a memory controller, for controlling access across multiple memory devices 1010 and/or for providing a translation layer between an external host and a memory device 1010. For example, there may not be a one-to-one correspondence between the number of contacts 1015 and a number of 1010 connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an ASIC. Also, the additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

CONCLUSION

Devices, methods, and systems for programming resistance variable memory, such as programmable conductor memory, resistance random access memory (RRAM), and/or phase change random access memory (PCRAM), among others, are described herein. One or more embodiments can include clamp circuitry as part of a programming scheme which can minimize the reverse bias leakage associated with unselected memory cells during a programming operation.

One or more embodiments can include an array of resistance variable memory cells, wherein the resistance variable memory cells are coupled to one or more data lines, a row decoder connected to a first side of the array, a column decoder connected to a second side of the array, wherein the second side is adjacent to the first side, a gap located adjacent to the row decoder and the column decoder, and clamp circuitry configured to control a reverse bias voltage associated with one or more unselected memory cells during a programming operation, wherein the clamp circuitry is located in the gap and is selectively coupled to the one or more data lines.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device comprising:
an array of memory cells;
a row decoder connected to the array;
a column decoder connected to the array;
a gap located adjacent to the row decoder and column decoder; and
circuitry located in the gap, wherein the circuitry includes clamp circuitry configured to pull one or more data lines coupled to the memory cells to a number of different voltages.

2. The device of claim 1, wherein the row decoder is connected to a first side of the array and the column decoder is connected to a second side of the array adjacent to the first side.

3. The device of claim 1, wherein the circuitry includes a number of transistors.

4. The device of claim 3, wherein the number of transistors include a number of p-channel metal oxide semiconductor (PMOS) transistors and/or a number of n-channel metal oxide semiconductor (NMOS) transistors.

5. The device of claim 1, wherein the device includes:
an additional array of memory cells;
an additional row decoder connected to the additional array;
an additional column decoder connected to the additional array;
an additional gap located adjacent to the additional row decoder and additional column decoder; and
additional circuitry located in the additional gap.

6. A memory device comprising:
an array of memory cells, wherein the memory cells are coupled to one or more data lines;
a row decoder connected to the array;
a column decoder connected to the array;
a gap located adjacent to the row decoder and column decoder; and
circuitry located in the gap, wherein the circuitry is configured to pull the one or more data lines to a number of different voltages.

7. The device of claim 6, wherein the number of different voltages include a voltage approximately one p-channel metal oxide semiconductor transistor threshold voltage above a reference voltage.

8. The device of claim 6, wherein the number of different voltages include a voltage approximately one p-channel metal oxide semiconductor transistor threshold voltage above ground.

9. The device of claim 6, wherein the number of different voltages include a voltage approximately one thick oxide n-channel metal oxide semiconductor transistor threshold voltage above ground.

10. The device of claim 6, wherein the number of different voltages include a voltage approximately one thin oxide n-channel metal oxide semiconductor transistor threshold voltage above ground.

11. A memory device comprising:
an array of memory cells divided into two subarrays;
a column decoder connected to the array and separated into two portions by a space, wherein each column decoder portion is associated with a different subarray; and
circuitry located in the space, wherein the circuitry includes clamp circuitry configured to pull one or more data lines coupled to the memory cells to a number of different voltages.

12. The device of claim 11, wherein:
the column decoder is connected to a first side of the array; and
the device includes a row decoder connected to a second side of the array adjacent to the first side.

13. The device of claim 12, wherein the device includes:
a gap located adjacent to the row decoder and column decoder; and
additional circuitry located in the gap, wherein the additional circuitry includes clamp circuitry.

14. The device of claim 11, wherein:
the array of memory cells is divided into the two subarrays by an area adjacent to the space; and
the area includes additional circuitry.

15. A method for operating an array of memory cells, comprising:
coupling one or more memory cells to circuitry located in a gap that is adjacent to the array; and
pulling the one or more memory cells to a selected voltage using the circuitry.

16. The method of claim 15, wherein coupling the one or more memory cells to the circuitry includes selectively coupling the one or more memory cells to the circuitry.

17. The method of claim 15, wherein coupling the one or more memory cells to the circuitry includes coupling one or more data lines to which the one or more memory cells are coupled to the circuitry.

18. The method of claim 15, wherein pulling the one or more memory cells to the selected voltage using the circuitry includes pulling one or more data lines to which the one or more memory cells are coupled to the selected voltage using the circuitry.

19. The method of claim 15, wherein the one or more memory cells are unselected memory cells.

20. A method for forming a memory device, comprising:
connecting a row decoder to a first side of a memory array;
connecting a column decoder to a second side of the array such that a gap is formed adjacent to the row decoder and column decoder; and
forming circuitry in the gap, wherein the circuitry includes clamp circuitry configured to pull one or more data lines coupled to memory cells of the array to a number of different voltages.

21. The method of claim 20, wherein the method includes selectively coupling the circuitry to the array.

22. The method of claim 20, wherein the method includes forming additional circuitry in a space that separates the column decoder into two portions.

23. The method of claim 20, wherein the first side of the array is adjacent to the second side.

24. The method of claim 20, wherein the memory array is a resistance variable memory array.

* * * * *